US 6,580,456 B1

(12) United States Patent
Jacobs

(10) Patent No.: US 6,580,456 B1
(45) Date of Patent: Jun. 17, 2003

(54) PROGRAMMABLE TIMING GENERATOR

(75) Inventor: William S. Jacobs, Santa Cruz, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/188,831

(22) Filed: Nov. 9, 1998

Related U.S. Application Data

(60) Provisional application No. 60/066,023, filed on Nov. 16, 1997.

(51) Int. Cl.[7] .................. H04N 5/335; H03K 23/46; G11C 19/00
(52) U.S. Cl. .................. 348/312; 348/296; 348/298; 317/77; 317/60
(58) Field of Search .................. 348/312, 296, 348/222.1, 269, 298, 311, 317, 320, 322, 362, 364; 377/77, 78, 60; 327/291, 295

(56) References Cited

U.S. PATENT DOCUMENTS

| | | | | |
|---|---|---|---|---|
| 4,630,307 A | | 12/1986 | Cok .................. 382/25 |
| 4,949,282 A | * | 8/1990 | Muraoka .................. 382/288 |
| 5,008,739 A | | 4/1991 | D'Luna et al. .................. 358/21 |
| 5,053,861 A | | 10/1991 | Tsai et al. .................. 358/13 |
| 5,185,771 A | * | 2/1993 | Anger et al. .................. 377/60 |
| 5,249,053 A | | 9/1993 | Jain .................. 358/209 |
| 5,373,322 A | | 12/1994 | Laroche et al. .................. 348/273 |
| 5,382,976 A | | 1/1995 | Hibbard .................. 348/273 |
| 5,483,290 A | * | 1/1996 | Ohtsubo et al. .................. 348/516 |
| 5,497,246 A | | 3/1996 | Abe .................. 358/426 |
| 5,534,921 A | | 7/1996 | Sawanobori .................. 348/333 |
| 5,629,734 A | | 5/1997 | Hamilton, Jr. et al. .................. 348/222 |
| 5,666,160 A | | 9/1997 | Hwang .................. 348/240 |
| 5,666,209 A | | 9/1997 | Abe .................. 386/109 |
| 5,982,428 A | * | 11/1999 | Charneski et al. .................. 348/312 |
| 6,124,889 A | * | 9/2000 | Landowski .................. 348/312 |
| 6,285,399 B1 | * | 9/2001 | Tao .................. 348/312 |
| 6,351,284 B1 | * | 2/2002 | Watanabe et al. .................. 348/312 |

* cited by examiner

Primary Examiner—Wendy R. Garber
Assistant Examiner—Lin Ye
(74) Attorney, Agent, or Firm—Farjami & Farjami LLP

(57) ABSTRACT

A programmable timing generator for a digital imaging system has a first clock generator and a second clock generator. The first clock generator includes a programmable microsequencer and generates a plurality of first clock signals in response to the microsequencer. The second programmable clock generator is responsive to the microsequencer and generates second clock signals. The first clock signals have a lower frequency than the second clock signals. In a typical implementation, the second clock signals are called horizontal clock signals, which are used for clocking rows of pixel data out of a digital image sensor, while the first clock signals are called vertical clock signals that are used for shifting pixel data one position in vertical shift registers in the digital image sensor. The horizontal or vertical clock signals can also be used to control the image capture operation of the digital sensor, with the programmable microsequencer being used to control the image capture exposure time.

19 Claims, 10 Drawing Sheets

HPG Output Waveforms During Capture

PROGRAMMABLE TIMING GENERATOR

The present application claims priority to United States Provisional Patent Application Ser. No. 60/066,023, titled PROGRAMMABLE TIMING GENERATOR, filed Nov. 16, 1997, which is incorporated by reference herein for all purposes.

The present invention relates generally to digital imaging, and particularly to a programmable timing generator for digital imaging.

BACKGROUND OF THE INVENTION

Advances in technology have made possible the electronic still camera for photography. In photographic cameras, the image-forming light is sensed and recorded directly on film. Unlike photographic cameras, the electronic still camera uses an electronic image sensor to sense the image-forming light and a separate recording medium to record and store the picture. Because the electronic still camera uses digital technology, the electronic still camera is a type of digital camera.

Typically the electronic image sensor in a digital camera is a solid-state device such as a charge-coupled device (CCD) or a CMOS device. The image sensor connects to electronic interface circuitry which connects to a storage device and, optionally, to a display.

A typical CCD has many cells or pixels arranged along vertical and horizontal dimensions in a matrix. In response to light, the cells generate a charge or voltage which represents image information. The image sensor senses an image and stores image information, i.e., a charge or voltage, corresponding to the sensed light in the cells. Image sensors are made in many sizes such as, e.g., 400×300, 640×480, 1024×768, and 4096×4096 pixels. The image information stored in the cells is output serially from the image sensor using an arrangement of shift registers. The shift registers are arranged along vertical and horizontal dimensions and are coupled to the cells. The cells and shift registers require timing, or clock, signals, having specific timing requirements, to output the image information. Each type of image sensor has its own unique timing requirements. Typically, a single image sensor requires many clock signals to control the flow of image information in both the horizontal and vertical dimensions. The clock signals must be synchronized. For example, to output image information from a 640×480 CCD requires 480 vertical shifts and 640 horizontal shifts for each vertical shift. Within a single dimension, the clock signals to control the flow of image information have different phases that must be synchronized. Furthermore, shifting the information out of the image sensor requires timing signals to synchronize the image sensor's operation with an analog signal processor (ASP) and an analog-to-digital (A/D) converter.

Typically, digital cameras use custom-designed dedicated hardware to control the timing of the image sensor, the ASP and the A/D converter. Because this circuitry is specific to a particular image sensor, image sensors cannot be interchanged. However, many types of image sensors from different manufacturers are available. Image sensors are also available in many sizes. Changing image sensors or adjusting the timing requires a redesign of hardware which is expensive and time consuming.

In addition, during the image acquisition process, the timing signals to control the image sensor may need to be changed. An image has a certain size or format. However, the desired image may have a different format from that of the image sensor. For example, the desired image may be cropped and not use the image information from all the available pixels. Not all the pixel information available from the image sensor may be required to achieve the desired format. Therefore, the image information that is read from an image sensor may need to be selected. To select the desired pixels, i.e., image information, the timing signals to control the image sensor need to be changed. With dedicated hardwired timing generators, the timing signals cannot be easily changed.

Therefore, there is a need for a method and apparatus to change the timing signals sent to the image sensor in a digital camera that is quick, inexpensive and flexible.

SUMMARY OF THE INVENTION

A programmable timing generator for a digital imaging system has a first clock generator and a second clock generator. The first clock generator includes a programmable microsequencer and generates a plurality of first clock signals in response to the microsequencer. The second programmable clock generator is responsive to the microsequencer and generates second clock signals. The first clock signals have a lower frequency than the second clock signals.

In a typical implementation, the second clock signals are called horizontal clock signals, which are used for clocking rows of pixel data out of a digital image sensor, while the first clock signals are called vertical clock signals that are used for shifting pixel data one position in vertical shift registers in the digital image sensor. The horizontal or vertical clock signals can also be used to control the image capture operation of the digital sensor, with the programmable microsequencer being used to control the image capture exposure time.

BRIEF DESCRIPTION OF THE DRAWINGS

FIG. 5b shows an exemplary two phase clock corresponding to the vertical clock signal of FIG. 5a.

FIG. 5c shows an exemplary two phase clock corresponding to the horizontal clock signal of FIG. 5a.

FIG. 6b is a block diagram of the exemplary noise filter of FIG. 6a.

DESCRIPTION OF THE PREFERRED EMBODIMENTS

Figure 1:
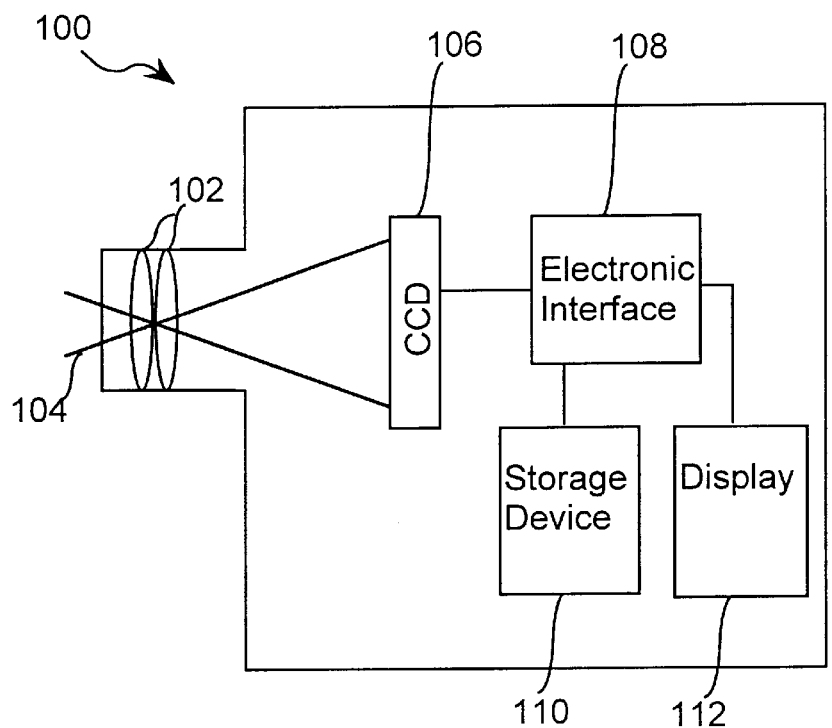
FIG. 1 is a block diagram of an electronic digital camera which embodies the programmable timing generator of the present invention.

FIG. 1 is a block diagram of an electronic still camera 100 which embodies the programmable timing generator of the present invention. A lens 102 transmits the image-forming light 104 onto an electronic image sensor (image sensor) 106. The image sensor 106 is built into the camera and is located at the focal plane of the lens. The image sensor 106 is typically a charge-coupled device (CCD) or a complementary metal-oxide-semiconductor (CMOS) sensor. Image sensors differ in the arrangement of the cells within the image sensor and the type of charge readout. The image sensor 106 connects to electronic interface circuitry 108. The electronic interface circuitry 108 also connects to a storage device 110 and an optional display 112. The electronic interface circuitry 108 controls the storage device 110 to store the image sensed by the image sensor 106. The storage device 110 can be a tape drive, a disk drive, such as a floppy disk drive, hard disk drive, optical disk drive or magneto-optical disk drive, or an integrated circuit card or chip with RAM or EEPROM. The storage device 110 can be within the digital camera 100 or attached to the camera externally. The electronic interface circuitry 108 can also control the display 112 to display the image sensed by the image sensor 106. The display 112 can be inside the digital camera or attached to the camera externally. The electronic interface circuitry can operate the display 112 in either a viewfinder mode or a review, i.e., image acquisition, mode.

Figure 2:
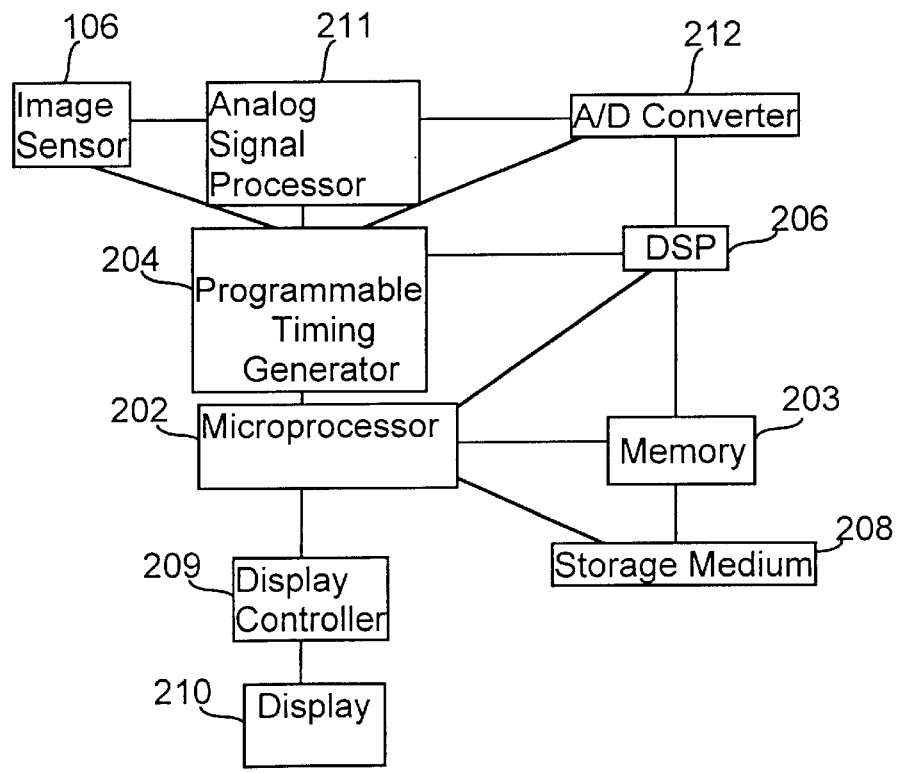
FIG. 2 is a detailed block diagram of the electronic interface circuitry of FIG. 1.

FIG. 2 is a block diagram of the electronic interface circuitry of the electronic digital camera of FIG. 1. A microprocessor 202 is coupled to a memory 203, a programmable timing generator 204, a digital signal processor (DSP) 206, a storage medium 208 and a display controller 209. The display controller 209 is coupled to a display 210. The image sensor 106 is coupled to an analog signal processor (ASP) 211 which is coupled to an analog-to-digital (A/D) converter 212. The programmable timing generator 204 is coupled to the image sensor 106, ASP 211, the A/D converter 212, the DSP 206 and the microprocessor 202. The DSP 206 is also coupled to memory 203. In addition, the memory 203 can comprise an image-memory to store the digital image data. Preferably, the image-memory is a high-speed DRAM. The A/D converter 212 supplies digital image data to the DSP 206 which stores the image data in the memory 203. The programmable timing generator 204 supplies timing signals to the DSP 206, ASP 211 and A/D Converter 212 to synchronize the transfer of digital image data between the ASP 211, the A/D converter 212 and the DSP 206.

The microprocessor 202 executes a camera operation procedure which is stored in memory 203. Alternatively the camera operation procedure can be stored in a read-only-memory, or loaded into a separate RAM memory from the storage medium 208. The camera operation procedure comprises an image acquisition procedure. When a user presses a store-image button (not shown), the camera operation procedure causes the image sensor 106 to acquire an image. The image acquisition procedure causes the microprocessor 202 to control the programmable timing generator 204 to generate vertical and horizontal clock signals for use by the image sensor 106. The image sensor 106 outputs image data comprising a series of analog signals corresponding to the color and intensity of image sensed by each cell. The image data is then sent to the ASP 211 and to the A/D converter 212.

The ASP 211 further processes the image data before input to the A/D converter 212. For example, the ASP 211 has a programmable amplifier to adjust the gain, and also reduces or eliminates noise, such as, e.g., reset noise, from the image data using methods well known to those in the art, such as correlation-double-sampling. The A/D converter 212 then converts the analog image data into digital image data. The digital image data is stored in memory 203 such as a high speed DRAM. The camera operation procedure causes the digital image data to be processed by the digital signal processor (DSP) 206. The processed digital image data is compressed and then recorded in a storage medium 208 or transferred to display controller 209 to output to a display 210.

U.S. Provisional Patent application, titled "Programmable Display Controller for a Digital Camera," Ser. No. 60/066,024, filed Nov. 16, 1997, is hereby incorporated by reference as background information for concerning the display controller 209. Also incorporated by reference is the corresponding U.S. patent application, Ser. No. 09/188,996, filed Nov. 9, 1998.

U.S. Provisional Patent application, titled "Programmable Image Transform Processor for a Digital Camera," Ser. No. 60/066,022, filed Nov. 16, 1997, is hereby incorporated by reference as background information concerning the digital signal processor 206. Also incorporated by reference is the corresponding U.S. patent application, Ser. No. 09/188,871, filed Nov. 9, 1998.

Figure 3:
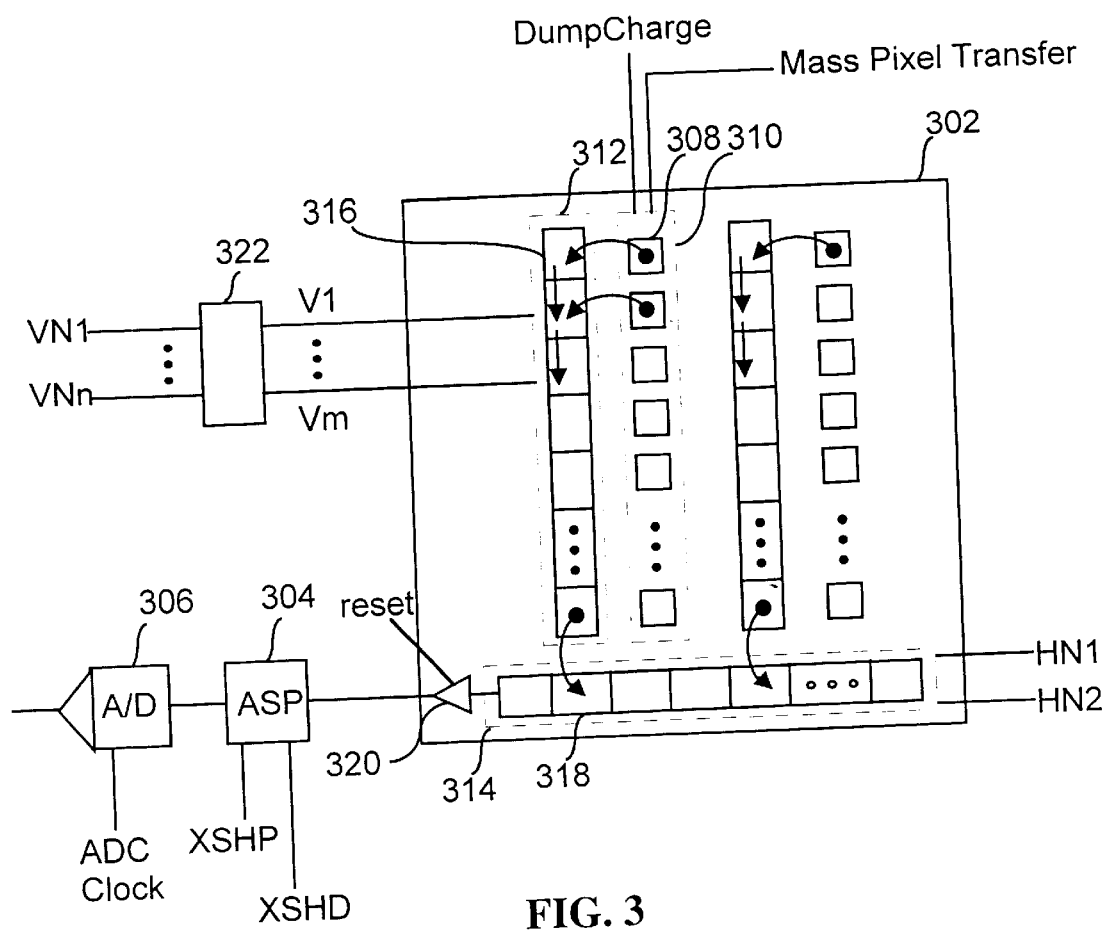
FIG. 3 is a diagram of an exemplary image sensor suitable for use with the present invention.

FIG. 3 is a block diagram of an exemplary image sensor suitable for use with the present invention. The image sensor 302 can be a CCD or CMOS device. In one embodiment, the image sensor 302 is a SHARP LZ23BP2 CCD sensor. The image sensor 302 connects to the ASP 304 and the A/D converter 306. The image sensor 302 has cells 308, vertical shift registers 312 and a horizontal shift register 314. Each cell 308 absorbs light and converts the light energy into an electrical charge. The amount of charge is a measure of the light energy absorbed. The size of the image sensor contributes to the quality of the image. The quality of the image improves as the number of cells increases. Image sensors are available in many sizes such as 400×300, 640×480, 1024×768, and 4096×4096 cells.

The components of the image sensor 302 are arranged along horizontal and vertical dimensions. An array 310 of cells 308 is arranged in the vertical dimension. The vertical shift register 312 has elements 316 for storing the charge sensed by the cells 308. Each cell 308 in the array of cells 310 connects to a corresponding element 316 in the vertical shift register 312.

Free charge moves from regions of higher potential to regions of lower potential. By alternating the voltage on the electrodes (not shown) connected to the cells 308 and the elements 316, 318 of the shift registers 312, 314 in proper phase, a charge packet, i.e., the charge from the cell 308, can be moved from the cell 308 to an element 316 of the shift register 312 and then moved from one element to another element in the shift registers.

In other words, when appropriate voltages are applied to the cell 308 and the corresponding element 316 in the vertical shift register 312, the charge generated in the cell 308 is transferred out of the cell 308 to the corresponding element 316 in the vertical shift register 312. The programmable timing generator is programmed to output timing or clock signals to cause the transfer of the charge to occur at the appropriate time. When appropriate voltages are applied to adjacent elements of the vertical shift register 312, the charge is transferred from one element to another. The last element or output of each vertical shift register 312 connects to a corresponding element 318 in the horizontal shift register 314. When appropriate voltages are applied to the last element of the vertical shift register 312 and the corresponding element 318 of the horizontal shift register 314, the charge is transferred from the vertical shift register 312 to the horizontal shift register 314. When appropriate voltages are applied to adjacent elements of the horizontal shift register 314, the charge is transferred from one element to another and finally output. The output of the horizontal shift register 314 connects to the ASP 304 via an output amplifier 320.

In summary, after transferring the charge from the cells 308 to the vertical shift registers 312, the programmable timing generator causes each element of the vertical shift register to be shifted out to the horizontal shift register 316 for input to the ASP 304 and the A/D converter 306. In an alternative embodiment, the ASP 304 is not used. In another alternative embodiment, the AND converter 306 is not used.

Color imaging is more complex. In one method, the image sensor 302 has a geometric arrangement of cells corresponding to three colors, e.g., red, green and blue. Alternatively, two or more image sensors having different color sensitivity are used. The programmable timing generator of the present invention works with both methods of color imaging.

The cells of the image sensor acquire an image or charge when exposed to light. Therefore, the image sensor has a port for receiving an OverFlowDrain pulse, or DumpCharge signal to reset the cells of the image sensor. The DumpCharge signal is pulsed one or more times prior to the start of exposure. The exposure time begins after the last DumpCharge pulse and ends when either a mechanical shutter is closed, or if an electronic shutter is used, when the accumulated charge in the cells is transferred to the vertical shift registers.

Various signals are used to control the image sensor and to synchronize its operation with other system components. An amplifier reset signal connects to the output amplifier 320. XSHP and XSHD signals control the ASP 304. An ADC clock signal connects to the A/D converter 306. Horizontal clock signals H$\phi$1 and H$\phi$2 control the horizontal shift register 314. Vertical clock signals V$\phi$1 to V$\phi$n connect to a vertical clock driver 322 that generates signals V1 to Vm to control the vertical shift registers. In one embodiment, signals V$\phi$1 to V$\phi$n are binary signals, while signals V1 to Vm are trinary signals that have three states. These signals will be further discussed below.

Figure 4:
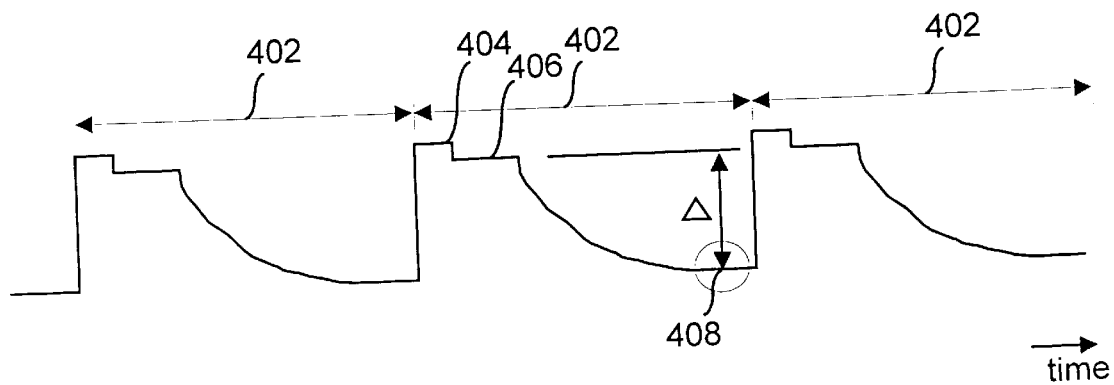
FIG. 4 is an exemplary waveform of the voltage output by a cell of the image sensor of FIG. 3.

FIG. 4 shows an exemplary waveform of the voltage for the output amplifier 320 of the image sensor of FIG. 3. In this example, the image sensor is a CCD. The waveform depicts three sensing cycles 402 for acquiring the image data for a pixel. In response to a reset signal, a reset region 404, having the highest voltage, is output. Next, a pedestal region 406, with a lower voltage, is output. The pedestal region 406 preconditions the CCD's output amplifier to a reference level to be sampled by a correlation doubler sampler which will be further explained below. A sensing region 408 has the relevant sensed image information. The charge or voltage output by the cell, i.e., the image data, is the potential difference between voltage of the pedestal region 406 and the sensing region 408.

The pedestal voltage is susceptible to low frequency variation. Various techniques well known to those in the art such as correlation double sampling are used to compensate for the low frequency variation.

The programmable timing generator also provides the DumpCharge signal to the image sensor using one of its vertical clock signal outputs. The programmable timing generator provides the sensor reset signal to the image sensor using one of its horizontal clock signal outputs.

Figure 5A:
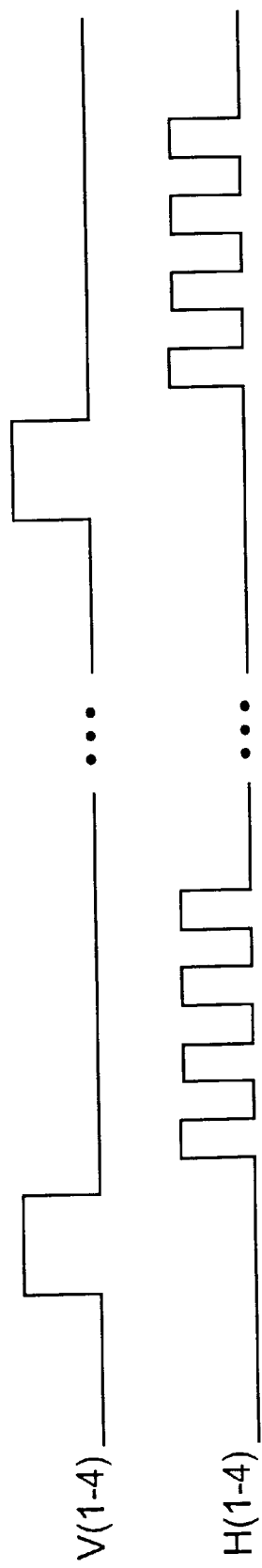
FIG. 5a is an exemplary timing diagram of vertical and horizontal clock signals used by the image sensor of FIG. 3.

FIG. 5a is an exemplary timing diagram of control signals used by the image sensor of FIG. 3. The vertical shift registers and horizontal shift registers store and transfer the charge from the cells. After an image has been sensed in the cells, the charge is transferred to the shift registers and serially output to the A/D converter. The control signals control the timing of the transfer of the charge between the cells and the vertical shift register, the timing of the transfer of the charge from element to element in the vertical shift register and between the vertical shift register and the horizontal shift register, and the timing of the transfer of the charge between elements of the horizontal shift register.

Waveform V(1-4) is a pulse which represents one shift of the vertical shift register. Waveform H(1-4) is a series of pulses representing the timing of the transfer of the charge in the horizontal shift register after being loaded with the image data from the vertical shift register. One shift of the vertical shift register corresponds to multiple shifts of the horizontal shift register. The number of horizontal shifts is determined by the width of the image sensor. For example, in a 640×480 CCD, there are 640 horizontal shifts for each vertical shift.

Figure 5C:
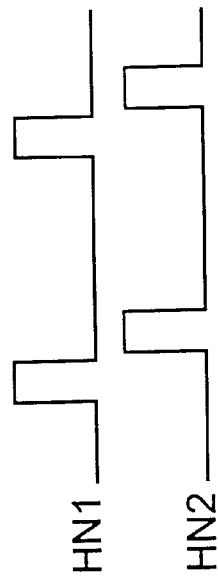
Figure 5B:

FIG. 5b shows an exemplary two phase clock corresponding to the vertical clock signal of FIG. 5a. Each shift of the vertical shift register is accomplished using two vertical shift pulses having different phases. In one embodiment, the clock signals V$\phi$1 and V$\phi$2 are transmitted to electrodes of the vertical shift registers to control the transfer of the charge in the vertical shift registers. In an alternate embodiment, the vertical clock signals V$\phi$1 and V$\phi$2 are transmitted to the vertical clock driver 320 (FIG. 3) which supplies the signals to the vertical shift registers.

The present invention is not limited to generating vertical clock signals having two phases. The invention can generate clock signals having a single phase, or three or more phases.

FIG. 5c shows an exemplary two phase clock corresponding to the horizontal clock signal of FIG. 5a. Like the vertical shift register, each shift of the horizontal shift register is accomplished using two horizontal shift pulses having different phases. The clock signals H$\phi$1 and H$\phi$2 are transmitted to electrodes of the horizontal shift register to control the movement of the charge through the horizontal shift register.

The present invention is not limited to generating horizontal clock signals having two phases. The invention can generate clock signals having a single phase, or three or more phases. In addition, the invention can generate vertical clock signals and horizontal clock signals that differ in the number of phases.

Figure 6A:
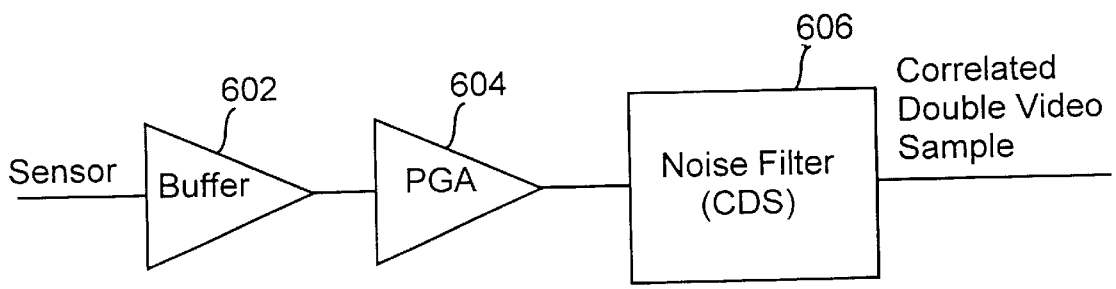
FIG. 6a is a block diagram of an exemplary analog signal processor suitable for use with the present invention.

FIG. 6a is a block diagram of an exemplary analog signal processor 211 suitable for use with the present invention. The image information, such as a charge packet, is shifted out of the image sensor and is input to a buffer amplifier 602. The output of the buffer amplifier 602 connects to a programmable gain amplifier (PGA) 604 which connects to a noise filter 606. The noise filter 606 removes the low frequency noise caused by variation in the pedestal portion of the image sensor signal.

Figure 6B:
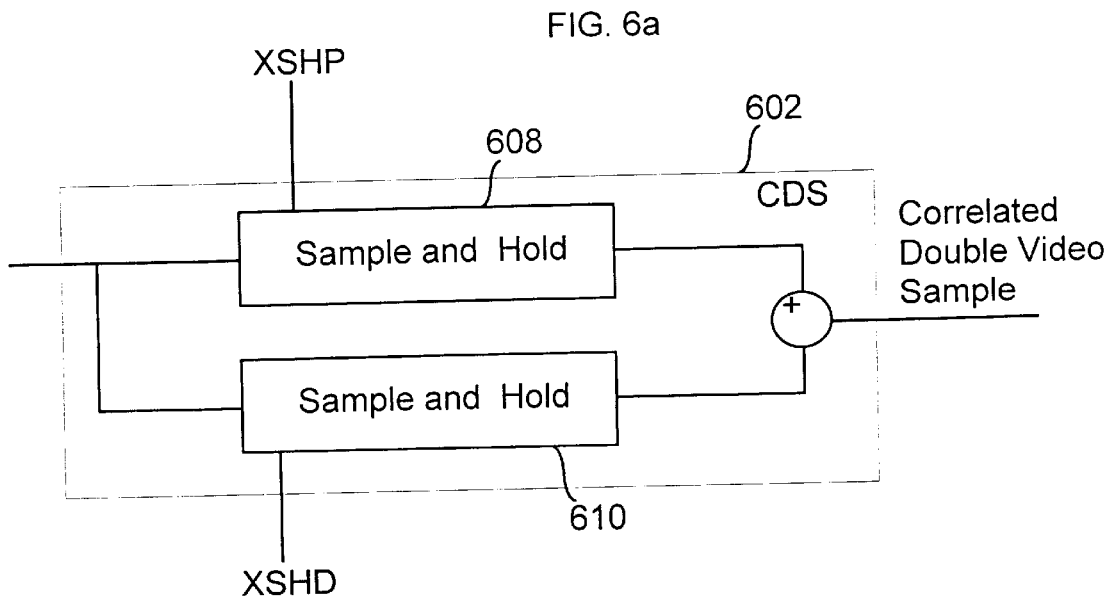

FIG. 6b is a block diagram of a preferred embodiment of the noise filter 606 of FIG. 6a. The noise filter uses correlated double video sampling (CDS), which is well-known to those in the art. In FIG. 6b, the correlated double sampling circuit has two sample and hold circuits 608 and 610 and the timing of the sample and hold circuits is synchronized with the timing of the image sensor via the XSHP and XSHD signals. The timing of the A/D converter is also synchronized with the timing of the analog signal processor and shift registers of the CCD. The programmable timing generator of the present invention supplies the timing, i.e., clock, signals to synchronize the image sensor, the analog signal processor and the A/D converter.

Figure 7:
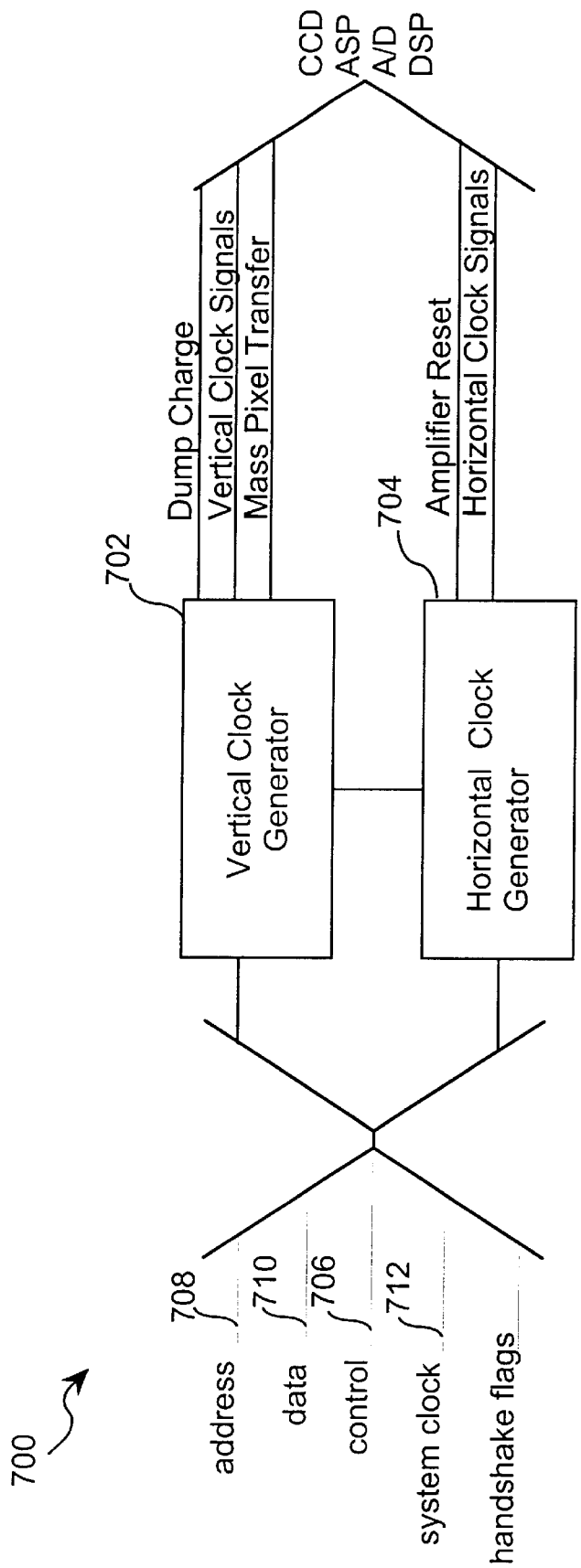
FIG. 7 is a block diagram of the programmable timing generator of the present invention.

FIG. 7 is a block diagram of the programmable timing generator of the present invention. The programmable timing generator 700 has a vertical clock generator 702 and a horizontal clock generator 704 and is coupled to the camera's microprocessor. The programmable timing generator 700 connects to control signals 706, an address bus 708, a data bus 710 and a system clock 712. The system clock 712 is input to the horizontal clock generator 704. The horizontal clock generator generates the horizontal clock signals that are used to output image data from a row of cells in the image sensor to the system. The horizontal clock generator also generates a pixel clock (pclock) that is used as a master clock by the vertical clock generator. The output of the programmable timing generator 700 connects to the image sensor, the analog signal processor, the A/D converter and the DSP. The vertical clock generator 702 provides the DumpCharge signal to the image sensor using one of the vertical clock generator 702 vertical clock signal outputs. The vertical clock generator 702 provides a mass pixel transfer signal to cause the image sensor to transfer the charge in its cells to the vertical shift registers in order to capture an image.

Figure 8:
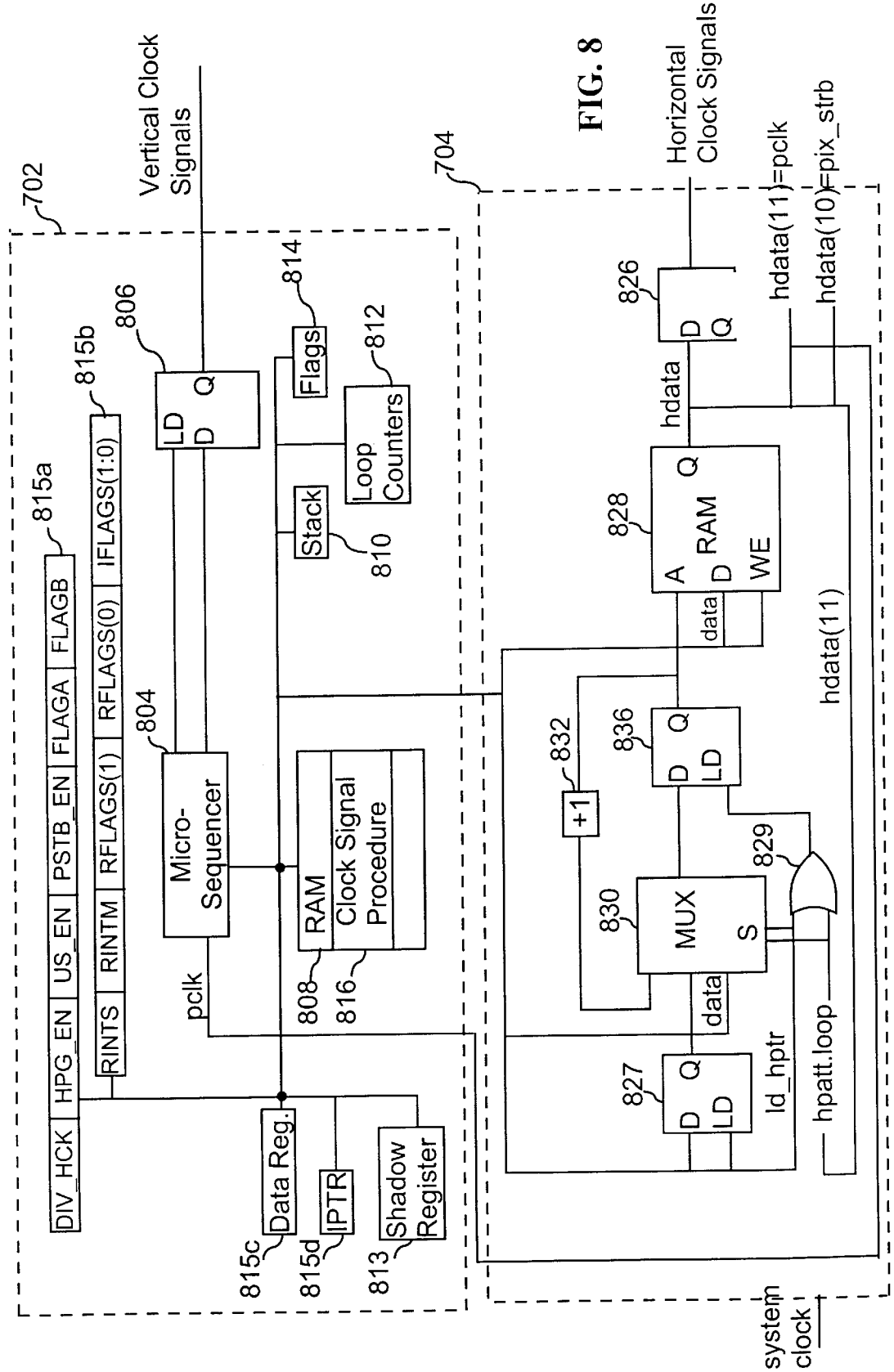
FIG. 8 is a detailed block diagram of the programmable timing generator of FIG. 7.

FIG. 8 is a detailed block diagram of the programmable timing generator (PTG) 700 of FIG. 7. The programmable timing generator 700 has a microsequencer 804 which is coupled to a plurality of vertical clock signal latches 806 for outputting sixteen vertical clock signals. The microsequencer is also coupled to the horizontal clock generator 704 for outputting twelve horizontal clock signals. However, the invention is not limited to sixteen vertical clock signals or twelve horizontal clock signals. In other embodiments, the programmable timing generator 700 generates from one to any number of horizontal or vertical clock signals.

The microsequencer 804 is connected to a memory, i.e., a RAM, 808, a stack 810, loop counters 812 with shadow registers 813, and flags 814. Although not shown in FIG. 8, the address bus 708, data bus 710 and control signals 706 (shown in FIG. 7) connect to the microsequencer 804, RAM 808, shadow registers 813, PTG control word register 815a, PTG status and interrupt register 815b, data register 815c and instruction pointer register 815d, all of which are memory mapped resources that can be read and/or written by the digital camera's main microprocessor 202 (FIG. 2).

The camera's main microprocessor and the programmable timing generator communicate via various fields in the PTG control register 815a and the status and interrupt register 815b in the vertical clock generator. These registers are used to synchronize the operation of the programmable timing generator 700 with the main microprocessor's control program, sometimes referred to as the camera operation procedure. The main microprocessor can also control the operation of the PTG 700 by loading data into a horizontal pattern memory 828, instruction pointer 815d and loop shadow registers 813. Table one below defines the fields of the PTG control register 815a.

TABLE 1

PTG Control Register Fields

| Name | Description |
| --- | --- |
| Div_HCLK | Divide HCLK: Setting this bit causes the horizontal pattern generator to run at one-half the system clock rate. |
| HPG_EN | Setting this bit enables the horizontal clock generator. |
| US_EN | Setting this bit enables the PTG microsequencer in the vertical clock generator. Enabling the microsequencer is a two step process: (1) set the HPG_EN bit to enable the horizontal pattern generator which clocks the microsequencer; and then (2) set the US_EN bit. To disable the PTG microsequencer, the US_EN bit is cleared first, then the HPG_EN bit is cleared. |
| PSTB_EN | Pixel Strobe enable. This bit is logically OR'ed with a signal from the PTG microsequencer to generate the pixel strobe signal (pix_strb) to the digital signal processor. |
| FLAGA, FLAGB | These bits are signals to the PTG microsequencer. The "JC" instruction can test and clear these bits. |

Table two below defines the bits of the status and interrupt register 815b.

TABLE 2

PTG Status and Interrupt Register

| Name | Description |
| --- | --- |
| RINTM | The camera microprocessor interrupt mask is equal to zero to disable interrupts to the camera's microprocessor and is equal to one to enable interrupts to the camera's microprocessor. |
| RFLAGS(1) | The PTG microsequencer FLAG instruction sets this bit. The camera's microprocessor clears this bit. |
| RFLAGS(0) | The PTG microsequencer FLAG instruction sets this bit. Only the camera's microprocessor clears this bit. This bit generates an interrupt to the camera's microprocessor. |

The camera's microprocessor can also load data into the shadow registers 813, instruction pointer register 815d, and data register 815c. To load data into RAM 808, the camera's microprocessor loads the instruction pointer register (IPTR) 815d with a RAM 808 address. After the camera's microprocessor has loaded the address into the instruction pointer register 815d, the camera's microprocessor can load a program and/or data into the RAM 808 via the data register 815c.

The microsequencer 804 executes many types of instructions and Table three below lists the instructions.

TABLE 3

PTG Microsequencer Instruction Set

| Instruction | Description |
| --- | --- |
| CALL | The Call subroutine instruction stores the current value of the instruction pointer plus one on the stack, toggles a stack pointer bit and loads the instruction pointer register with the subroutine address. The subroutine is terminated with a return (RET) instruction. |
| FLAG | The Flag instruction sets flag bits in the flag register with the five bit immediate value specified in the instruction, thus controlling the PSE, RF1, RF0, IF1, and IF0 flag bits. |

TABLE 3-continued

PTG Microsequencer Instruction Set

| Instruction | Description |
|---|---|
| HPAT | The HPAT instruction loads the horizontal clock generator's (HCG) pattern register to set an address in the horizontal pattern register that is used as a starting address for generating the horizontal clock signals. |
| JMP | Jump (JMP) causes the instruction pointer of the microsequencer to be loaded with the specified address. |
| JC | Jump conditional (JC) causes the microsequencer to jump to a specified instruction address if the specified condition is true. Otherwise, the program executes from the next instruction. |
| LPCH | Load loop counter high bits (LPCH) loads a specified value into the four high-order bits of a specified loop counter register. |
| LPCL | Load loop counter low (LPCL) bits loads a specified value into the four low-order bits of a specified loop counter register. |
| LPCS | Load loop counter from shadow (LPCS) loads a specified loop counter with the twelve-bit value stored in a specified shadow register. The camera's main microprocessor can write to the shadow registers. |
| LUPE | The Loop (LUPE) instruction causes the execution of a program loop. The number of iterations of the loop is determined by a value that is loaded in a specified loop counter. When the loop counter has a value greater than zero, the counter is decremented and the program jumps to a designated address. The designated address is typically the address at or before the LUPE instruction. When the loop counter is equal to zero, program execution proceeds with the next instruction. |
| NOP | No operation (NOP) takes no action and the program executes the next instruction. |
| RET | Return from subroutine (RET) loads the instruction pointer with the value stored in the stack and toggles the stack pointer bit. Program execution proceeds with the instruction following the CALL instruction. |
| VREG | Load vertical register (VREG) loads the vertical clock signal latches (the VREG or VXREG registers) with a specified eight-bit value to generate the vertical clock signals. |

The RAM 808 is used to store a clock signal procedure 816 to generate the vertical clock signals and select horizontal clock patterns stored in a horizontal memory, i.e., RAM 828. The clock signal procedure 816 can comprise a vertical clock signal procedure, a horizontal clock pattern selection, or a combination of different clock signal procedures and horizontal clock patterns. The camera's microprocessor loads the RAM 808 with the clock signal procedure 816. The RAM 808 can be loaded with the clock signal procedure 816 initially when the camera is turned on, before image acquisition, or between successive exposures while taking a photograph. Once the clock signal procedure 816 is loaded in the RAM 808, the clock signal procedure 816 can be modified. The clock signal procedure 816 can be changed during the time when images are being acquired. The clock signal procedure can be modified before, after and between exposures. For example, acquiring a single image may involve a dozen exposures. The clock signal procedure can be modified between exposures based on a determination of the image quality. For example, the length of the exposure of the cells to the light can be increased or decreased. Alternately, the number of cells read out can be modified.

Upon receiving a command from the camera's microprocessor, the microsequencer 804 executes the clock signal procedure 816 to generate the vertical and horizontal clock signals. The microsequencer 804 executes load instructions to load an instruction pointer, instruction data, loop counters 812, loop pointer, and call and return instructions which use the stack 810. The RAM 808 has a sixteen bit data bus. The microsequencer 804 uses a sixteen bit instruction set. The instructions are organized as a four bit opcode with two operands, i.e., operand A and operand B. In other embodiments, the instruction set may use a different number of bits and have a different organization. For example, a clock signal procedure 816 may have a vertical clock signal procedure having a set of load, loop and jump instructions causing the latches 806 to be loaded with a sequence of predetermined patterns of "ones" and "zeros" at the appropriate times.

The microsequencer 804 also controls the horizontal clock generator. The horizontal clock generator is used to generate the horizontal clock signals which have a higher frequency than the vertical clock signals. However, in an alternative embodiment, the means and method used to generate the vertical clock signals can also be used to generate the horizontal clock signals.

The horizontal clock generator 704 has horizontal clock signal latches 826 for outputting the horizontal clock signals. The horizontal clock generator 704 connects to the microsequencer 804 and to the camera's microprocessor, which loads RAM 828 with a set or sequence of predetermined horizontal patterns to output as horizontal clock signals. The output of the RAM 828 connects to the horizontal clock signal latches 826, which output the horizontal clock signals. Each horizontal pattern stored in the RAM 828 corresponds to the horizontal clock signals needed to perform a particular image sensor control function.

In one embodiment, the horizontal clock generator's RAM 828 is loaded with a set of patterns and, in particular, an IDLE pattern, an ACTIVE pattern and a CAPTURE pattern. The IDLE, ACTIVE and CAPTURE patterns will be explained in further detail below. An exemplary horizontal clock signal bit assignment and corresponding memory map for the horizontal clock signal latches 826 are shown below in tables four and five, respectively.

TABLE 4

Horizontal clock Signals and pin/bit assignments

| Bit | Signal Name | Description |
|---|---|---|
| 0 | XSHP | Noise Filter Sample and Hold Pre-data |
| 1 | XSHD | Noise Filter Sample and Hold data |
| 2 | ADCClk | A/D converter clock |
| 3 | H$\phi$1 | CCD Horizontal Clock - phase 1 |
| 4 | H$\phi$2 | CCD Horizontal Clock - phase 2 |
| 5 | XRS | CCD Reset |
| 6 | not used | — |
| 7 | not used | — |
| 8 | PSALIAS | Pixel Strobe Alias for diagnostics |
| 9 | not used | — |
| 10 | PIX_STRB | Pixel Strobe |
| 11 | PCLOCK | Pixel Clock that is supplied to vertical clock generator microsequencer. |

In the memory map in Table five, the leftmost bit is bit eleven and the rightmost bit is bit zero. A zero represents a low voltage level, and a one represents a high voltage level. An X represents a "don't care" condition.

TABLE 5

Exemplary Memory Map

| Pattern Name | Bit 11 to Bit 0 |
| --- | --- |
| IDLE: | 00X0 XX11 0111 |
|  | 00X0 XX11 0111 |
|  | 00X0 XX11 0011 |
|  | 10X0 XX11 0011 |
|  | 00X0 XX11 0011 |
| ACTIVE | 00X0 XX11 0111 |
|  | 00X0 XX11 0111 |
|  | 00X0 XX11 0011 |
|  | 10X0 XX11 1011 |
|  | 00X0 XX11 1001 |
| CAPTURE | 00X0 XX11 0111 |
|  | 00X0 XX11 0111 |
|  | 00X0 XX11 0010 |
|  | 10X0 XX10 1011 |
|  | 01X1 XX10 1001 |

Horizontal-pointer-latches 836 connect to the address input of the RAM 828. A multiplexor 830 connects to the horizontal-pointer-latches 836 and supplies the horizontal-pointer-latches 836 with an address. The address is supplied by several sources. One input to the multiplexor 830 connects to the data bus, another input to the multiplexor 830 connects to horizontal pattern register 827, and another input to the multiplexor 830 connects to the output of an incrementer 832. A select input of the multiplexor 830 selects one of the three inputs for output to the horizontal-pointer latches 836 based on the value of two signals: the Id_hptr signal from the microsequencer 804 and the hpatt.loop signal, which is one of the hdata signals output by the RAM 828. The output of the horizontal-pointer latches 836 also connects to the incrementer 832. The incrementer 832 increments the address stored in the horizontal-pointer-latches 836 by one to point to the next RAM 828 address.

The horizontal-pointer-latches 836 store an address and output the address to the RAM 828. The RAM 828 connects to the data bus and is loaded with a plurality of predetermined clock patterns to be output by the horizontal clock signal latches 826. The address stored in the horizontal-pointer-latches 836 can be initialized by the microsequencer 804 via the horizontal pattern register 827, used with a loop counter and incremented by the incrementer 832, or can be set from the camera's microprocessor. After the RAM 828 and horizontal-pointer-latches 836 are loaded, the microsequencer, via instructions in the clock signal procedure, can initiate the output of the horizontal clock signals.

The microsequencer 804 receives a pixel clock (pclk) pulse from the horizontal clock generator 704 each time it outputs any of the horizontal clock signal patterns stored in the RAM 828. In one embodiment, the pixel clock signal is the hdata(11) output from the horizontal pattern RAM 828. The microsequencer 804 executes one instruction in its clock signal procedure 816 each time that it receives a pixel clock pulse. The microsequencer 804 uses its loop instruction (LUPE) and the loop counters 812 to count pixel clock pulses, and thus to count the number of times the currently selected horizontal clock signal pattern has been repeated. In this way the microsequencer 804 is synchronized to the output of the horizontal clock signals and determines when to change the horizontal clock signal pattern being used by the horizontal clock generator.

In one embodiment, the horizontal clock generator 704 uses one of the horizontal clock signals, hdata(11), to create a loop function within the horizontal clock generator 704. In particular, the hdata(11) signal is connected as an hpatt.loop signal to control the address selected by the multiplexer 830 and loaded into the horizontal-pointer-latches 836. During the loop, the hpatt.loop signal is programmed to be in a first predetermined state to cause the multiplexer 830 to select the new address output from the incrementer 832. When the RAM 828 output changes the state of the hpatt.loop signal, the multiplexer 830 selects the starting address of the loop which is stored in the horizontal pattern register 827, the starting address is loaded into the horizontal-pointer latches 836, and the horizontal clock signal pattern is repeated.

The pixel clock signal is also coupled to the A/D converter and the DSP to provide a timing signal to synchronize the transfer of pixels between the A/D converter and the DSP.

Timing sequences for controlling the image sensor can be selected based on a user requested mode of operation, such as still frame acquisition and video frame acquisition. For example, video frame acquisition would be used in a viewfinder mode of operation. To rapidly switch between modes, the camera's microprocessor can dynamically load new clock signal sequences and microcontroller procedures into the programmable timing generator 700. Thus, the programmable timing generator 700 can be programmed to provide images for processing into still frames using a still-frame-acquisition procedure, and to provide images for processing into video frames using a video-frame-acquisition procedure. The camera's microprocessor selects which procedure (and corresponding signal patterns) to download into the programmable timing generator 700 based on the user interface buttons pressed by the use of the digital camera.

Figure 9:
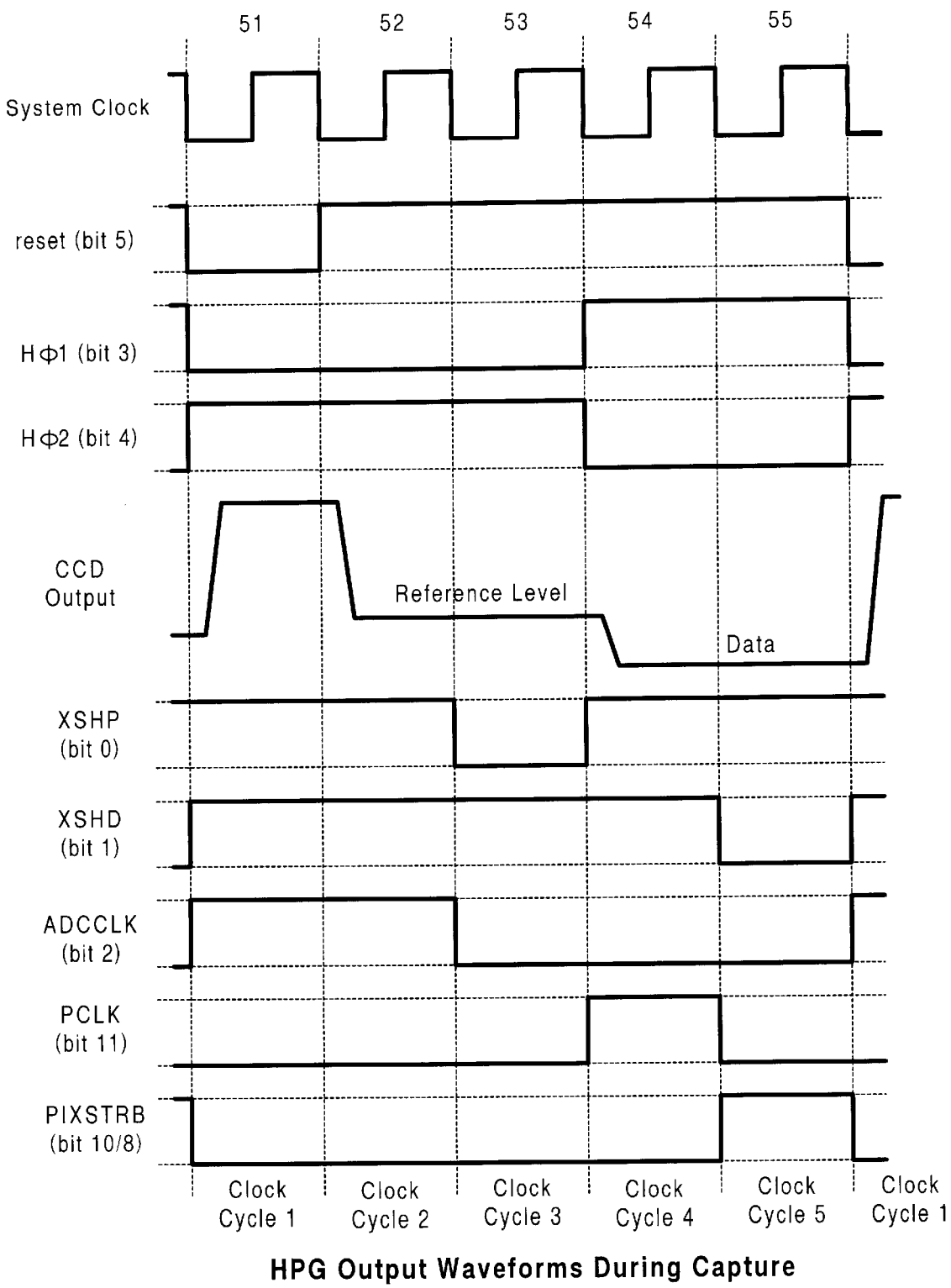
FIG. 9 is an exemplary timing diagram of the horizontal clock signals output by the horizontal clock generator of FIG. 8.

FIG. 9 is an exemplary timing diagram of horizontal clock signals output by the programmable timing generator of FIG. 8 for the "CAPTURE" pattern shown in the memory map above with the bit assignments of Table 4. This pattern is used to capture a single pixel of data (i.e., read one pixel of data from the image sensor and shift the image sensor's horizontal shift register by one pixel position). The signals synchronize the operation of the image sensor, the A/D converter, the noise filter in the analog signal processor CDS, and the DSP. The CAPTURE pattern is used to capture and store a desired image. When the horizontal clock generator outputs the CAPTURE pattern, the Pixel strobe signal is supplied to the DSP to process the incoming pixel data and store that pixel data in memory.

A system clock is input and the horizontal clock signals are synchronized to the system clock. In a preferred embodiment, the system clock operates at approximately 57.3 MHz However, other system clock rates can be used in other embodiments of the invention.

Each cycle of the system clock corresponds to a state S1, S2, S3, S4 and S5. In this example, the reset pulse is output in state S1 which causes the CCD's output amplifier to generate a reset voltage in the reset region as was described above with reference to FIG. 4. Meanwhile, a two phase clock is generated using two horizontal latches. Horizontal latch bit three outputs horizontal clock signal Hφ1, and horizontal latch bit four outputs horizontal clock signal Hφ2. For state S1, horizontal latch bits three and four will output the pattern "01," respectively. In this example, the two phase clock does not have a fifty percent duty cycle; the clock duty cycle may vary from one implementation to another.

The XSHP and XSHD signals are supplied to the noise filter in the analog signal processor. The A/D Converter clock is supplied to the A/D converter. The pclock signal is supplied to the PTG microsequencer 804 (FIG. 8) as the microsequencer clock and is also supplied to the horizontal clock generator 704 (FIG. 8) as the hpatt.loop signal.

In state S2, the reset signal transitions back to a high voltage level, while the other signals remain unchanged. In state S3, the XSHP signal has a low voltage level to cause the CDS to sample the reference level output by the CCD. The A/D Converter clock signal also transitions to a low voltage level to cause the A/D converter to generate a digital signal representing the voltage of the reference level.

In state S4, the pclock signal is pulsed high which supplies a clock pulse to the vertical clock generator. In this embodiment, pclock is pulsed once every five system clock cycles. Therefore pclock has a frequency of approximately 11.5 MHZ. The pclock signal also reloads the horizontal pointer latches 836 with the address stored in the horizontal pattern register 827. (Sometimes the horizontal point latches and the incrementer 832 are collectively called the horizontal generator address counter.) For instance, to output the CAPTURE pattern, the horizontal pattern register 827 stores the starting address of the CAPTURE pattern in the RAM 828. The pclock signal is pulsed high in state S4. The two-phase horizontal clock signals H$\phi$1 and H$\phi$2 also transition to different voltage levels.

In state S5, since the image data from the CCD output has stabilized in the "data" region, the XSHD signal is pulsed to a low voltage level to cause the analog signal processor to process the pixel data output by the sensor's output amplifier 320 (see FIG. 3). In addition, the pixel strobe signal transitions high to cause the DSP to receive the pixel data output by the A/D converter via the CDS.

A detailed explanation of how the horizontal clock signals control the ADC is beyond the scope of this document, which only concerns the operation of the programmable timing generator.

The ACTIVE pattern generates a set of signals that are similar to those generated for the CAPTURE pattern except that the pixel strobe (pix_strb) signal is not pulsed. Therefore, the image data is not transferred to the DSP and is not stored.

The IDLE pattern generates signals similar to those generated for the ACTIVE pattern except that no XSHP, XSHD, H$\phi$1, H$\phi$2 and Reset pulses are generated.

To change the output pattern, the microsequencer loads the horizontal pattern latches with a new starting address to change operating modes, such as from CAPTURE to ACTIVE.

In this way, the programmable timing generator can generate horizontal clock signals having different duty cycles, phase relationships and frequencies. Similarly, the programmable timing generator can generate a plurality of vertical clock signals having different duty cycles, phase relationships and frequencies. In addition, the relationship between the vertical clock signals and horizontal clock signals can be controlled and changed.

Capturing an Image

An overview of the image acquisition process will be described with reference to FIG. 10. Then the image capture process will be explained in more detail with reference to FIGS. 11 and 12.

Figure 10:
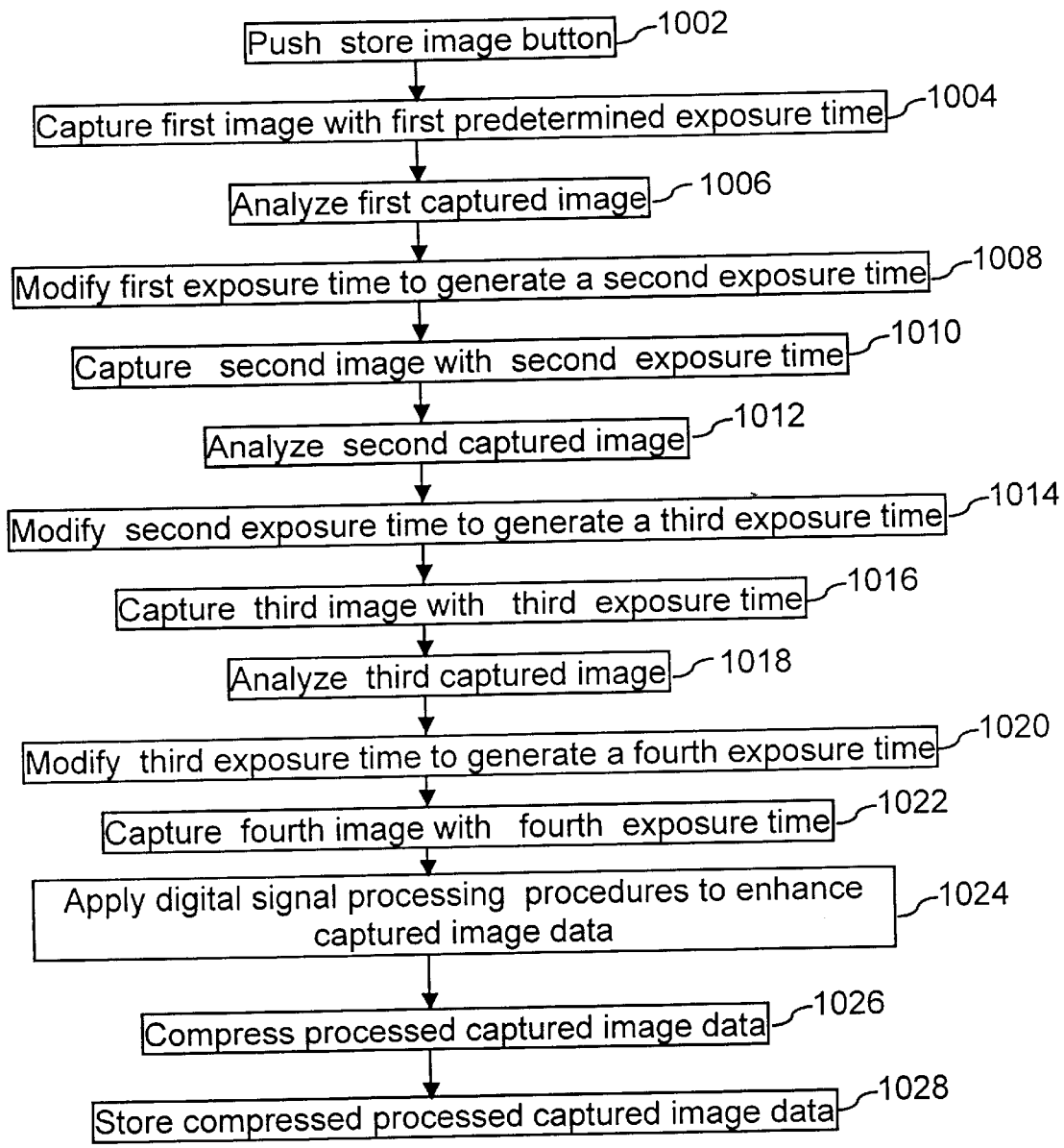
FIG. 10 is a flowchart of an exemplary image acquisition procedure.

Referring to FIG. 10, to acquire an image a user presses a store-image button (step 1002). In response, an image acquisition procedure is executed by the camera's microprocessor (step 1004). In one embodiment, the image acquisition procedure uses a short exposure time as the first exposure time to acquire the first image (step 1004). Next, the image acquisition procedure automatically determines the proper exposure time for an image by acquiring a series of images. In step 1006, the first image is analyzed. The image acquisition procedure determines if the image is underexposed. If so, the camera's microprocessor acquires a second image using a much longer exposure time. In step 1008, the camera's microprocessor changes the first predetermined exposure time in the clock signal procedure to a second exposure time in the programmable timing generator. In step 1010, the image acquisition procedure captures an image using the second exposure time. In step 1012, the image acquisition procedure determines if the image is overexposed. If so, in step 1014, the image acquisition procedure modifies the exposure time to a third exposure time. In step 1016, the image acquisition procedure captures a third image using the third exposure time. The third image is analyzed (step 1018), the third exposure time is modified to a fourth exposure time based on the analysis (step 1020), and a fourth and final image is captured (step 1022). The image acquisition procedure applies digital signal processing procedures to the fourth captured image (step 1024), compresses the processed image data (step 1026) and stores the compressed image data on a storage medium (step 1028).

Figure 11:
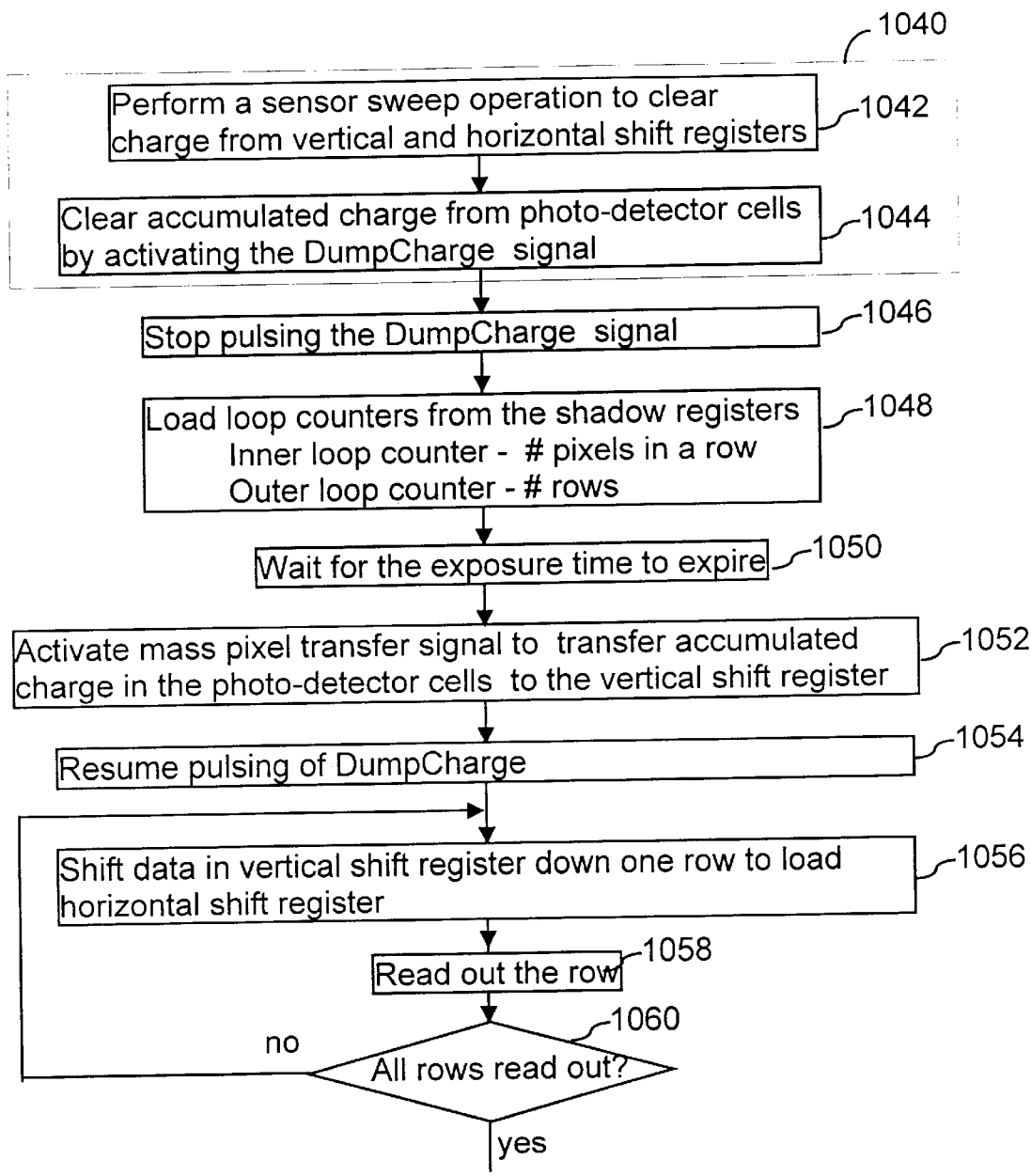
FIG. 11 is a detailed flowchart of a capture image procedure of FIG. 10.

FIG. 11 is a detailed flowchart of a clock signal procedure that is used to capture an image in steps 1004, 1010, 1016 and 1020 of the image acquisition procedure of FIG. 10. The image acquisition procedure causes the programmable timing generator's microsequencer to execute the clock signal procedure. The clock signal procedure has a sensor reset procedure 1040. In step 1042, the sensor reset procedure executes a sensor sweep procedure which has microinstructions to generate vertical clock signals to completely shift down or sweep the charge out of all the elements of the vertical shift registers. The microsequencer executes the sensor sweep procedure and generates a series of vertical clock signals. The sweep of the vertical shift registers is done to systematically eliminate the charge from the shift registers. In step 1044, the sensor reset procedure 1040 also causes the microsequencer to execute a series of instructions to generate the DumpCharge signal to the image sensor for a predetermined time using one of the vertical clock outputs of the vertical clock generator as the DumpCharge signal. The DumpCharge signal is made active and dumps the accumulated charge from the cells.

In step 1046, the clock signal procedure causes the DumpCharge signal to be released and light from the desired image accumulates in the cells (photo-receptors). In step 1048, the clock signal procedure initializes an inner loop counter with the number of pixels in a row of the image sensor and initializes an outer loop counter with number of rows in the image sensor. The camera's microprocessor has programmed the clock signal procedure in the programmable timing generator with a predetermined exposure time. In step 1050, the clock signal procedure waits for the predetermined exposure time to accumulate the charge in the cells. In step 1052, after the exposure time expires, the clock signal procedure outputs the mass pixel transfer signal to transfer the accumulated charge from the image sensor cells to the vertical shift registers. Vertical clock signals output from the programmable timing generator are connected to the appropriate mass pixel transfer inputs of the image sensor. Note that the mass pixel transfer and the DumpCharge signals are generated by the vertical clock generator and are output by the vertical clock latches.

The mass pixel transfer and sensor reset signals are distinct from the vertical clock signals V$\phi$1 and V$\phi$2 that are input to the image sensor. At the end of the predetermined exposure time, the clock signal procedure causes an appropriate timing sequence to be output to the mass pixel transfer signal inputs of the image sensor to transfer the charge from the cells to the vertical shift registers en mass. After the mass pixel transfer, in step 1054, the clock signal procedure resumes pulsing of the DumpCharge signal. In step 1056, to load the horizontal shift register, the data or charge in the vertical shift register is shifted down one row by outputting the appropriate sequence of vertical clock signals V$\phi$1 and V$\phi$2. In step 1058, the row of data in the horizontal shift register is read out and transferred to the ASP, the A/D converter and the DSP. In other words, in steps 1056 and 1058, the clock signal procedure causes a sequence of vertical and horizontal clock signals to be generated to the vertical and horizontal clock inputs of the image sensor to transfer image information, in the form of charge, from the vertical shift registers to the horizontal shift register and then out to the analog signal processor. Step 1060 determines if all rows have been read out. If not, the procedure loops back to step 1056, and if so the clock signal procedure is complete.

Figure 12:
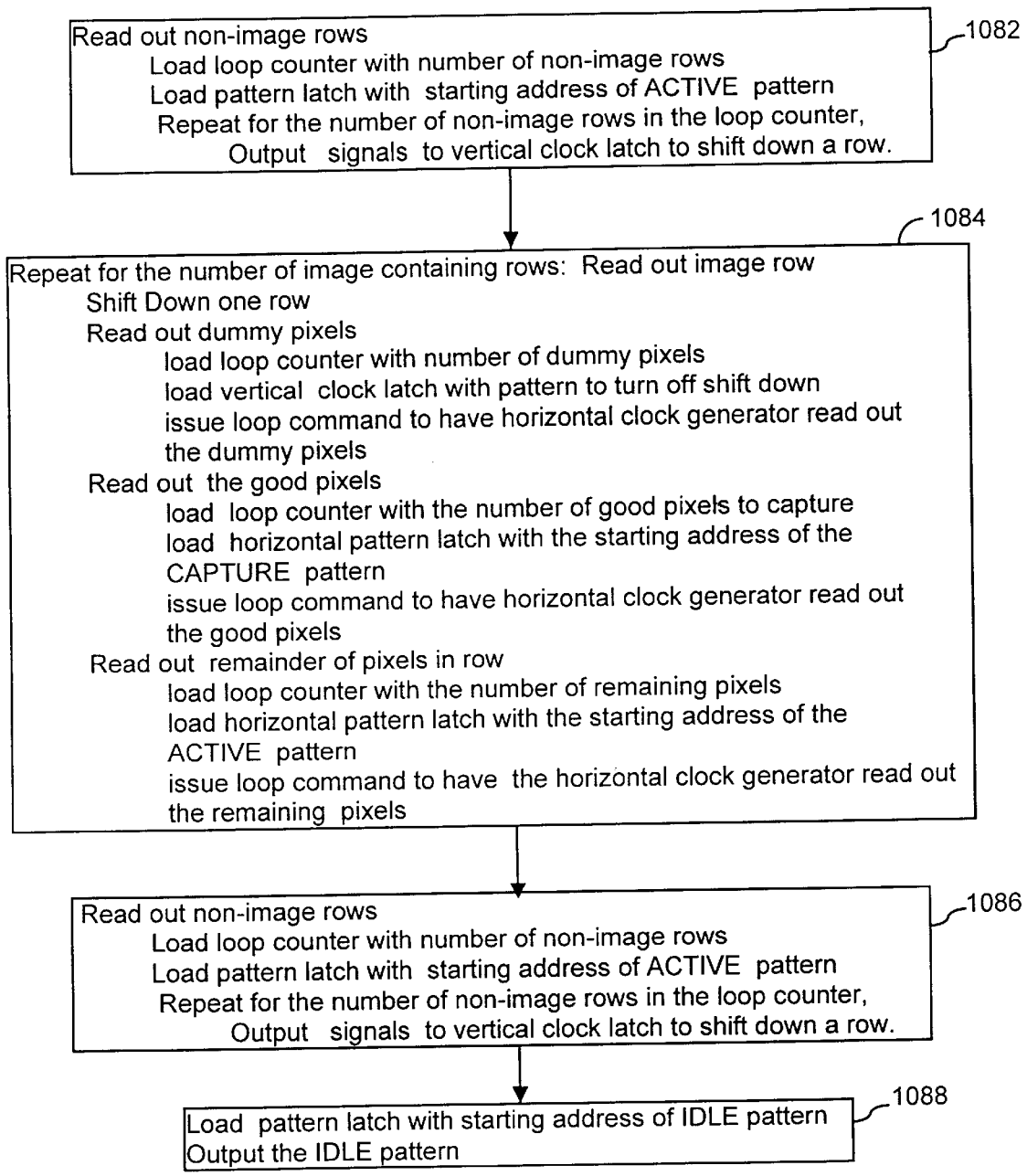
FIG. 12 is a more detailed flowchart of the capture image procedure of FIG. 11.

FIG. 12 is a more detailed flowchart of the capture image procedure. Although the image sensor has been described as though all cells were used, in practice the image sensor has a region of good cells surrounded by non-image rows above and below the good cells, and dummy or black pixels at the beginning and end of each row.

In step 1082, the capture image procedure (CIP) reads out the non-image rows. The CIP loads the loop counter with the number of non-image rows, and loads the horizontal pattern latch with the starting address of the ACTIVE pattern. The CIP then issues the LUPE command to cause the vertical clock generator to output vertical clock signals to shift down the number of non-image rows specified in the loop counter.

In step 1084, the image containing rows are shifted down and read out. For each image row, the vertical clock generator outputs signals via the vertical clock latch to shift down one row to place the data in the horizontal shift register. The dummy pixels are read out, the good pixels are read out, and then the remainder of the pixels in the row are read out from the horizontal shift register.

To read out the dummy pixels in a row, a loop counter is loaded with the number of dummy pixels, and the vertical clock latches are loaded with a pattern to disable shifting down. Then, a LUPE command is issued based on the loop counter storing the number of dummy pixels to "read out" (i.e., shift out, but not store) the dummy pixels.

To read out the good pixels in the row, a loop counter is loaded with the number of good pixels to capture, and the horizontal pattern latch is loaded with the starting address of the CAPTURE pattern in the horizontal pattern generator RAM. A LUPE command is issued based on the loop counter storing the number of good pixels to read out the good pixels. Since the CAPTURE pattern is loaded, the image information for the good pixels is transferred to the DSP and stored in the image memory.

After reading out the good pixels in the row, the remainder of the pixels in a row are read out. A loop counter is loaded with the number of remaining pixels to capture, and the horizontal pattern latch is loaded with the starting address of the ACTIVE pattern in the horizontal pattern generator RAM. A LUPE command is issued based on the loop counter storing the number of remaining pixels in the row to "read out" (i.e., shift out, but not store) the remaining pixels.

In step 1086, the remaining non-image rows are read out, but not stored in memory. A loop counter is loaded with the number of non-image rows, and the horizontal pattern latch is loaded with the starting address of the ACTIVE pattern. The CIP issues the LUPE command to cause the vertical clock generator to output vertical clock signals to shift down the number of non-image rows specified in the loop counter.

In step 1088, the horizontal pattern latch is loaded with the starting address of the IDLE pattern, which is output by the horizontal clock generator.

The programmable timing generator is implemented in hardware as an integrated circuit. Alternatively, the programmable timing generator is implemented using discrete components.

Because the present invention is programmable, the present invention has the advantages of providing flexibility, and allows the clock signals to be modified easily and at a low cost.

Although the programmable timing generator has been described for use with an electronic digital still camera, the programmable timing generator can be used in any device using an image sensor, such as, e.g., video and television cameras.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A programmable timing generator for use in a digital imaging system that includes an image sensor and image data processing circuitry, comprising:

a first clock generator including a programmable microsequencer, for generating a plurality of first clock signals in response to instructions executed by the microsequencer; and a second programmable clock generator, responsive to the microsequencer, for generating a plurality of second clock signals, the second programmable clock generator including:

a clock pattern memory operably configured to store at least one clock pattern to output as the second clock signals;

a starting address latch operably connected to the microsequencer to store a starting address of a selected one of the clock patterns stored in the clock pattern memory; and address generation circuitry operably connected to the starting address latch for generating a sequence of address signals so as to access the selected one of the clock patterns in the clock pattern memory over a predefined number of clock periods;

wherein the first clock signals include a first set of signals coupled to the image sensor to control a first set of image sensor functions and the second clock signals include a second set of signals coupled to the image sensor to control a second set of image sensor functions, wherein a subset of the second set of signals are also coupled to the image data processing circuitry so as to synchronize operation of the image sensor with operation of the image data processing circuitry.

2. The programmable timing generator of claim 1 wherein one of the second clock signals is a pixel clock signal that is coupled to the first clock generator as a master clock signal for driving the programmable microsequencer.

3. The programmable timing generator of claim 2 wherein the first clock generator includes a plurality of latches for generating ones of the plurality of first clock signals, and an instruction memory for storing a clock signal procedure that is executed by the programmable microsequencer, the clock signal procedure including instructions specifying values to load into the latches so as to generate the plurality of first clock signals;

the clock pattern memory stores at least two distinct clock patterns, including one clock pattern to be used while transferring image data from the image sensor to the image data processing circuitry for processing and storage, and at least one other clock pattern; and the microsequencer, under control of the clock signal procedure, loads the starting address of the selected clock pattern into the starting address latch in accordance with a current mode of operation of the digital imaging system.

4. The programmable timing generator of claim 2, wherein the address generation circuitry includes a pointer latch coupled to the clock pattern memory that stores a current address used to read clock pattern data from the clock pattern memory, one of the second clock signals is used as a loop signal that causes the starting address stored in the starting address latch to be loaded into the pointer latch, and the second programmable clock generator repeatedly outputs the selected one of the clock patterns.

5. The programmable timing generator of claim 4, wherein the address generation circuitry in the second programmable clock generator includes an incrementer operably coupled to the pointer latch to increment the current address stored by the pointer latch.

6. The programmable timing generator of claim 5, wherein the incrementer has an input operably connected to receive the current address of the pointer latch and an output, and the address generation circuitry further comprises:

a multiplexor coupled to the starting address latch, the microsequencer, and the output of the incrementer, the multiplexor having a select input operably coupled to one of the second clock signals and an output operably connected to the pointer latch.

7. The programmable timing generator of claim 2, wherein the first clock generator includes:

a loop counter operably connected to the microsequencer for storing and updating a count value; and a shadow register that stores a value that is loaded into the loop counter upon execution of a corresponding instruction by the microsequencer;

wherein the count value stored in the loop counter is updated in response to the first clock generator receiving the pixel clock; and the clock signal procedure includes at least one instruction that causes the microsequencer to provide the starting address latch with the starting address of another of the clock patterns stored in the clock pattern memory when the count value generated by loop counter is equal to a predefined loop end value.

8. A digital camera, comprising:

an image sensor for generating image data that is responsive to a plurality of first clock signals and also to a plurality of second clock signals;

an image memory for storing the image data;

signal processing circuitry coupled to the image sensor and the image memory;

a programmable timing generator for use in a digital imaging system, comprising:

a first clock generator including a programmable microsequencer for generating the first clock signals in response to instructions executed by the microsequencer; and a second programmable clock generator, responsive to the programmable microsequencer, for generating the second clock signals, the first clock signals having a lower frequency than the second clock signals, wherein one of the plurality of second clock signals is a pixel clock signal coupled to the image sensor and the signal processing circuitry to synchronize transfer of image data from the image sensor to the image memory, and wherein the pixel clock signal is coupled to the first clock generator as a master clock for the programmable microsequencer.

9. The digital camera of claim 8, the signal processing circuitry including a digital signal processor, wherein the pixel clock signal synchronizes the transfer of the image data from the image sensor to the image memory via the digital signal processor.

10. The digital camera of claim 9, the signal processing circuitry including an A/D converter, wherein another one of the plurality of second clock signals is an A/D converter clock signal that controls when the A/D converter converts the image data from the image sensor into a digital data signal to be transferred to the digital signal processor.

11. The digital camera of claim 10, wherein the second programmable clock generator includes:

a clock pattern memory operably configured to store at least one clock pattern to output as the second clock signals;

a starting address latch operably connected to the microsequencer to store a starting address of a selected one of the clock patterns stored in the clock pattern memory; and address generation circuitry operably connected to the starting address latch to generate a sequence of address signals so as to access the selected one of the clock patterns in the clock pattern memory over a predefined number of clock periods;

the first clock signals include a first set of signals coupled to the image sensor to control a first set of image sensor functions; and the second clock signals include a second set of signals coupled to the image sensor to control a second set of image sensor functions, wherein a subset of the second set of signals are also coupled to the image data processing circuitry so as to synchronize operation of the image sensor with operation of the image data processing circuitry.

12. The digital camera of claim 11 wherein the first clock generator includes a plurality of latches for generating ones of the plurality of first clock signals, and an instruction memory for storing a clock signal procedure that is executed by the programmable microsequencer, the clock signal procedure including instructions specifying values to load into the latches so as to generate the plurality of first clock signals;

the clock pattern memory stores at least two distinct clock patterns, including one clock pattern to be used while transferring image data from the image sensor to the image data processing circuitry for processing and storage, and at least one other clock pattern; and the microsequencer, under control of the clock signal procedure, loads the starting address of the selected clock pattern into the starting address latch in accordance with a current mode of operation of the digital imaging system.

13. The digital camera of claim 11 wherein the address generation circuitry includes a pointer latch coupled to the clock pattern memory that stores a current address used to read clock pattern data from the clock pattern memory, and one of the second clock signals is used as a loop signal that causes the starting address stored in the starting address latch to be loaded into the pointer latch, and the second programmable clock generator repeatedly outputs the selected one of the clock patterns.

14. The digital camera of the claim 13, wherein the address generation circuitry in the second programmable clock generator includes an incrementer operably coupled to the pointer latch to increment the current address stored by the pointer latch.

15. The digital camera of claim 14, wherein the incrementer has an input operably connected to receive the current address of the pointer latch and an output, and the address generation circuitry further comprises:

a multiplexor coupled to the starting address latch, the microsequencer, and the output of the incrementer, the multiplexor having a select input operably coupled to one of the second clock signals and an output operably connected to the pointer latch.

16. The digital camera of claim 12, wherein the first clock generator includes:

a loop counter operably connected to the microsequencer for storing and updating a count value; and a shadow register that stores a value that is loaded into the loop counter upon execution of a corresponding instruction by the microsequencer;

wherein the count value stored in the loop counter is updated in response to the first clock generator receiving the pixel clock; and the clock signal procedure includes at least one instruction that causes the microsequencer to provide the starting address latch with the starting address of another of the clock patterns stored in the clock pattern memory when the count value generated by loop counter is equal to a predefined loop end value.

17. A programmable timing generator for controlling an image sensor in a digital imaging system, comprising:

a vertical clock generator having a programmable microsequencer operably configured to execute a clock signal procedure having a plurality of instructions, the vertical clock generator operably configured to generate a plurality of vertical clock signals in response to at least one of the instructions executed by the microsequencer; and a horizontal clock generator operably connected to the programmable microsequencer and having:

a clock pattern memory having a plurality of addresses, and operably configured to store a plurality of clock patterns and to selectively output a plurality of horizontal clock signals corresponding to the clock patterns, each clock pattern having a plurality of states, each state of each clock pattern being stored at a different one of the addresses of the clock pattern memory;

a starting address latch operably connected to the microsequencer to store a starting address of a selected one of the clock patterns stored in the clock pattern memory; and address generation means operably connected to the microsequencer and to the starting address latch for generating a sequence of address signals to access each state of the selected one of the clock patterns stored in the clock pattern memory.

18. The programmable timing generator of claim 17, wherein the address generation means comprises:

a pointer latch operably connected to the clock pattern memory;

an incrementer having an output and an input operably connected to the pointer latch;

a multiplexor having a plurality of inputs operably connected to the starting address latch and the output of the incrementer, the multiplexor having a select input operably connected to the microsequencer and having an output operably connected to the pointer latch, wherein the pointer latch is operably configured to receive the starting address of the selected one of the clock patterns in response to a load signal present on the select input of the multiplexor.

19. The programmable timing generator of claim 18, wherein the multiplexor has another control input operably connected to one of the horizontal clock signals, and the pointer latch is operably configured to receive an incremented address from the incrementer in response to a loop signal present on the other select input of the multiplexor.

* * * * *